United States Patent
Egawa

(10) Patent No.: US 9,252,177 B2
(45) Date of Patent: Feb. 2, 2016

(54) SOLID STATE IMAGING DEVICE

(75) Inventor: Yoshitaka Egawa, Kanagawa-ken (JP)

(73) Assignee: Kabuhiki Kaisha Toshiba, Tokyo (JP)

( * ) Notice: Subject to any disclaimer, the term of this patent is extended or adjusted under 35 U.S.C. 154(b) by 433 days.

(21) Appl. No.: 13/603,255

(22) Filed: Sep. 4, 2012

(65) Prior Publication Data
US 2013/0182155 A1    Jul. 18, 2013

(30) Foreign Application Priority Data

Jan. 12, 2012    (JP) ................................. 2012-004059

(51) Int. Cl.
*H01L 27/146*    (2006.01)

(52) U.S. Cl.
CPC ...... *H01L 27/14627* (2013.01); *H01L 27/1463* (2013.01); *H01L 27/14629* (2013.01); *H01L 27/14645* (2013.01)

(58) Field of Classification Search
CPC ............. H01L 27/14627; H01L 27/14629; H01L 27/1463; H01L 27/14645; H01L 27/146; H01L 257/292; H01L 359/515; H01L 27/307; G02B 5/08; G02B 359/838; G02F 2203/12
USPC .......... 348/294; 250/208.1, 226, 216
See application file for complete search history.

(56) References Cited

U.S. PATENT DOCUMENTS

| | | | |
|---|---|---|---|
| 2005/0213221 A1* | 9/2005 | Hoshuyama | 359/642 |
| 2009/0040345 A1* | 2/2009 | Fukuyoshi et al. | 348/273 |
| 2011/0037869 A1* | 2/2011 | Hiramoto et al. | 348/222.1 |

FOREIGN PATENT DOCUMENTS

| | | |
|---|---|---|
| JP | H11087674 A | 3/1999 |
| JP | 2004193284 A | 7/2004 |
| JP | 2005333131 A | 12/2005 |
| JP | 2007-259232 | 10/2007 |
| JP | 2008-060323 | 3/2008 |
| JP | 2009-009971 | 1/2009 |
| JP | 200927004 A | 2/2009 |
| JP | 2010-114323 | 5/2010 |
| JP | 2011-029453 | 2/2011 |
| WO | 2010058545 A1 | 5/2010 |

OTHER PUBLICATIONS

Japanese Office Action dated Nov. 11, 2014, filed in Japanese counterpart Application No. 2012-004059, 9 pages (with translation).

* cited by examiner

*Primary Examiner* — Mekonnen Dagnew
(74) *Attorney, Agent, or Firm* — Patterson & Sheridan, LLP

(57) ABSTRACT

According to one embodiment, a solid state image sensor has a photoelectric conversion element array, a light collecting optical element array, wavelength-selective elements and a reflecting unit. Wavelength-selective elements pass light of the color which is to be detected, and reflect other colors. The reflecting unit further reflects the light that has been reflected by the wavelength-selective elements. The cell includes photoelectric conversion elements for three different light colors. A microlens serving as a light collecting optical element is arranged corresponding to the cell. The reflecting unit includes at least a first reflecting surface and a second reflecting surface. The first reflecting surface faces the wavelength-selective elements. In every cell, the second reflecting surface is enclosed between wavelength-selective elements and the first reflecting surface.

20 Claims, 19 Drawing Sheets

SOLID STATE IMAGING DEVICE

CROSS-REFERENCE TO RELATED APPLICATION

This application is based upon and claims the benefit of priority from Japanese Patent Application No. 2012-004059, filed Jan. 12, 2012; the entire contents of which are incorporated herein by reference.

FIELD

Embodiments described herein relate to a solid state imaging device.

BACKGROUND

There is an ongoing demand for smaller, thinner camera modules for use in cellphones and other electronic devices. Image sensors in the camera modules require miniaturization of pixels as well as an increase the number of pixels to achieve this smaller size while maintaining high-resolution in the image sensor. However, as pixel size decreases, the signal-to-noise ratio (SNR) becomes problematic, since signal attenuation increases when there is a decrease in light being available to the individual smaller pixels.

In some conventional image sensors, color images are produced using interpolation techniques that approximate colors in the produced image. However, the interpolation of colors may result in lower effective resolution. In other conventional image sensors, multiple dichroic mirrors are placed in the path of incident light, which results in enhanced color sensing by the image sensor. However, these types of image sensors are very expensive to manufacture. Additionally, the wavelength characteristics of the dichroic mirrors largely depend on the incidence angle of incoming light, which may cause the half wave length in the spectral characteristic to shift by several tens of nanometers due to a difference between the actual and expected light incidence angle. The difference in the spectral characteristics is further exaggerated because the dichroic mirrors have different characteristics when processing different wavelengths, which causes a degradation of the color reproduction. In addition, due to light polarization in the dichroic mirror, the transmission and the reflection characteristics differ greatly due to the presence of parallel (P) waves at the incident surface and perpendicular (S) waves at the incident surface. The presence of these waves causes the color separation characteristics to degrade.

What is needed is an image sensor having greater color sensitivity and improved optical efficiency.

DETAILED DESCRIPTION

In general, according to one embodiment, the solid-state imaging device mentioned in the embodiments is explained in detail with reference to the accompanying FIGS., as follows. It is contemplated that elements disclosed in one embodiment may be beneficially utilized on other embodiments without specific recitation. This invention is not limited to these embodiments.

According to the embodiments of the invention, there is provided a solid state imaging device with excellent color separation characteristics and high light efficiency, which produces highly sensitive images and may be manufactured at a lower cost.

According to one embodiment of this invention, the solid state imaging device has a photoelectric conversion element array, a light-collecting optical element array, a wavelength-selective element, and a reflector. The photoelectric conversion element array is equipped with a plurality of photoelectric conversion elements. Each of the photoelectric conversion elements detects different wavelength ranges of light. The light-collecting optical element array is installed on the light-incident side of the photoelectric conversion element array. The light-collecting array is provided with a light collecting optical element that focuses the light. The wavelength-selective element passes light with the wavelength range that is to be detected by a photoelectric conversion element dedicated for the wavelength range and reflects the other wavelength ranges. The reflecting unit further reflects the light which has been reflected by the wavelength-selective element. The photoelectric conversion element array is composed of a plurality of cell units. Each cell contains a photoelectric conversion element for a given light color. The light collecting optical element is matched to its cell. The reflecting unit contains at least a first and second reflecting surface. The first reflecting surface opposes the wavelength-selective element, while the second reflecting surface surrounds each cell between the wavelength-selective element and the first reflecting surface.

First Embodiment

Figure 1:
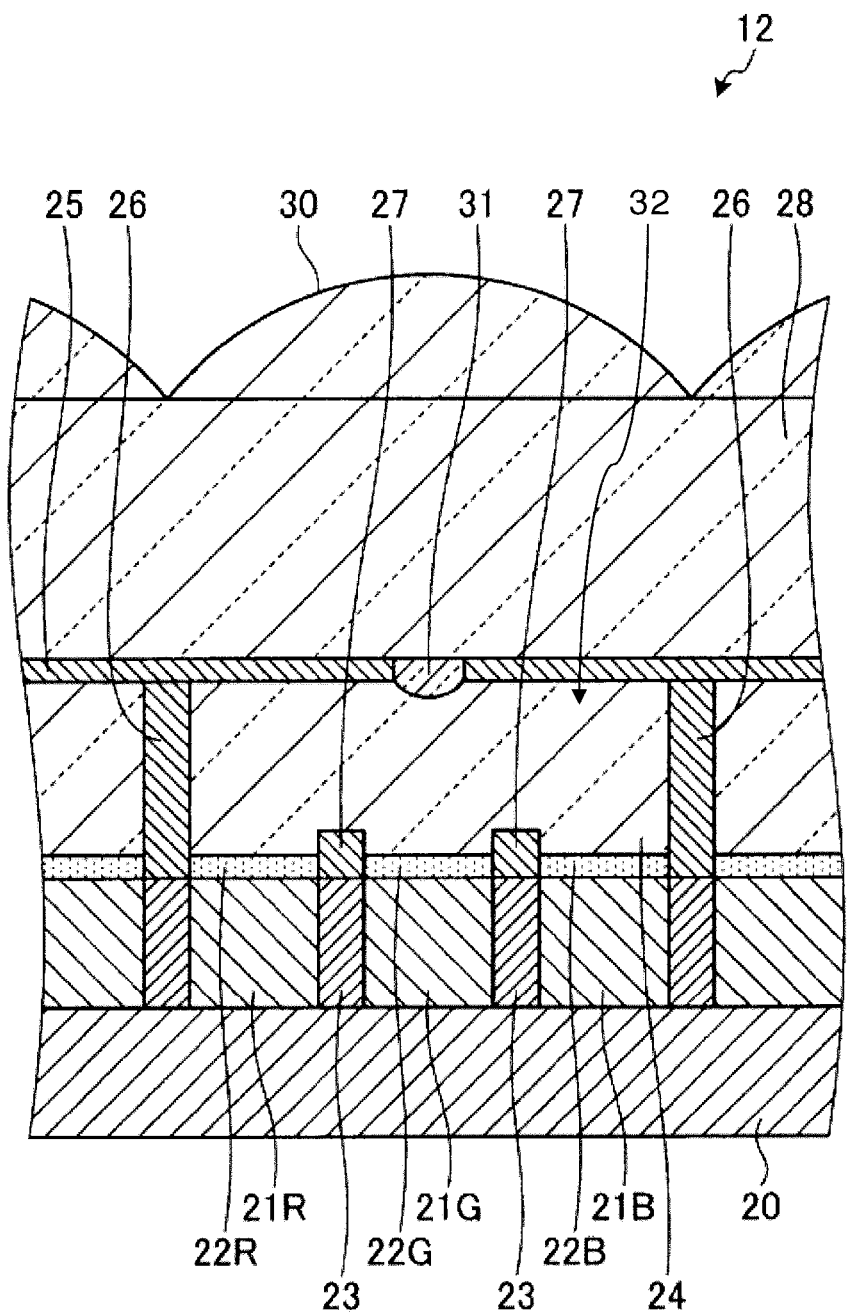
FIG. 1 is a schematic cross-sectional diagram showing a portion of a solid-state image sensor according to one embodiment.
Figure 2:
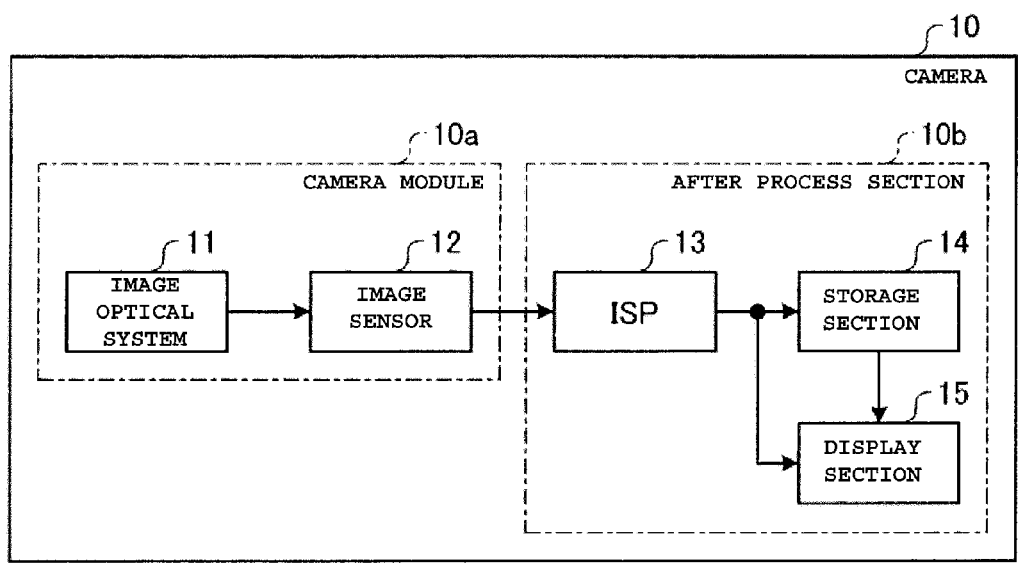
FIG. 2 is a schematic diagram showing a camera that may utilize embodiments the solid-state image sensor described herein.

FIG. 1 is a schematic sectional diagram showing part of a solid-state image sensor 12 according to the first embodiment. FIG. 2 is a block diagram showing a camera 10 in which embodiments of the solid-state image sensors as described herein may be employed.

The camera 10 includes a camera module 10a and a subsequent processing unit 10b. The camera module 10a includes an imaging optical system 11 and the image sensor 12. The subsequent processing unit 10b includes the image signal processor (ISP) 13, storage unit 14, and display unit 15. The camera 10 is a digital camera, for example. The camera module 10a is used with electronic equipment such as camera-equipped mobile electronic devices, as well as the digital camera.

The imaging optical system 11 takes light from an object to be imaged to form an image of object. The image sensor 12 takes an image of the object. ISP 13 processes the image signal obtained from the image sensor 12. The storage unit 14 stores the image by which the signal processing in ISP 13 is passed. The storage unit 14 outputs the image signal to the display 15 according to a user request. The display unit 15 may comprise a liquid crystal display that displays the image in response to the image signal input from the ISP 13 or storage unit 14.

Referring to FIG. 1, the image sensor 12 includes the photoelectric conversion element array. The photoelectric conversion element array includes plural photoelectric conversion elements 21R, 21G, and 21B arranged in the array shape. The designation R, G and B are, with respect to reference numeral 21, representative of three distinct wavelengths of light that may be collected in order to store, and later render, a color reproduction image of the object imaged by the camera. One common approach to this imaging, storing and rendering is to detect colors in the wavelengths corresponding R to the color red, B to the color blue, and G to the color green, although other variants are contemplated herein. The photoelectric conversion elements 21R, 21G, and 21B are N-type photo diodes on a P-type semiconductor substrate 20.

In this first embodiment, the photoelectric conversion element 21R detects wavelength ranges corresponding to red (R) light, which is the first wavelength range. The photoelectric conversion element 21B detects wavelength ranges corresponding to blue (B) light, which is the second light color. The photoelectric conversion element 21G detects wavelength ranges corresponding to green (G) light, which is the third light color. In each case, the conversion elements 21R, 21G and 21B are operatively coupled to individual wavelength-selective elements or filters as described herein.

The photoelectric conversion elements 21R, 21G, and 21B generate an electric signal corresponding to the intensity of the incident rays. The photoelectric conversion elements 21R, 21G, and 21B detect light of the appropriate wavelength ranges. For instance, image sensor 12 could be a CMOS sensor. This embodiment can be applied for both of front-side illumination and back-side illumination CMOS sensor types.

Referring still to FIG. 1, wavelength selective elements 22R, 22G and 22B overlay the light receiving surface of corresponding photoelectric conversion elements 21R, 21G and 21B. The wavelength-selective element 22R on the light receiving surface of the photoelectric conversion element 21R transmits wavelength ranges corresponding to R light, the color which is to be detected by the photoelectric conversion element 21R, and also reflects wavelength ranges corresponding to the other colors R and G. The wavelength-selective element 22R is a filter for the first color light.

The wavelength-selective element 22B on the light receiving surface of photoelectric conversion element 21B transmits wavelength ranges corresponding to B light, the second color which is to be detected by the photoelectric conversion element 21B, and reflects wavelength ranges corresponding to the other colors R and G.

The wavelength-selective element 22G on the light receiving surface of photoelectric conversion element 21G transmits wavelength ranges corresponding to the G light, the third color, which is detected by the photoelectric conversion element 21G. The other colors R and B are reflected.

The wavelength-selective elements 22R, 22G, and 22B pass light of the given color to the photoelectric conversion elements 21R, 21G, and 21B by transmission and reflection. The wavelength-selective elements 22R, 22G, and 22B are made from pearl pigments, photonic crystals (nano structures), and/or dichroic filters. The wavelength-selective elements 22R, 22G, and 22B made from pearl pigments uniformly coat a substrate of fine titania (e.g., $TiO_2$) particles of nano size and the thin-film interference effect of light is used by controlling the thickness of the coating layer. The wavelength-selective elements 22R, 22G, and 22B comprising a dichroic mirror have a multi-layer film located in the upper part of pigments.

A reflective barrier 23 surrounds the body of each photoelectric conversion element within the body of substrate 20 and thus isolates the adjacent photoelectric conversion elements 21R, 21G, and 21B from each other. The reflective barrier 23 reflects light from passing through the photoelectric conversion element 21R, 21G, and 21B. A deep trenching DRAM structure may be used as the separating reflective barrier 23.

A microlens array is formed on the incident surface where light impinges the image sensor 12. The microlens array includes plural microlenses 30 arranged in an array. The microlens 30 serves as the light-collecting optical element at which the incident light from the imaging optical system 11 of the camera 10 of FIG. 2 is focused. The microlens array collects light incident thereon that is transmitted therethrough to the photoelectric conversion element array. In one aspect, as the G component will significantly influence the appearance of the image, each microlens 30 is designed to centralize the light on the receiving surface of photoelectric conversion element 21G, and yet have light passing through that microlens which will also reach adjacent photoelectric conversion elements 21B and 21R.

Figure 3:
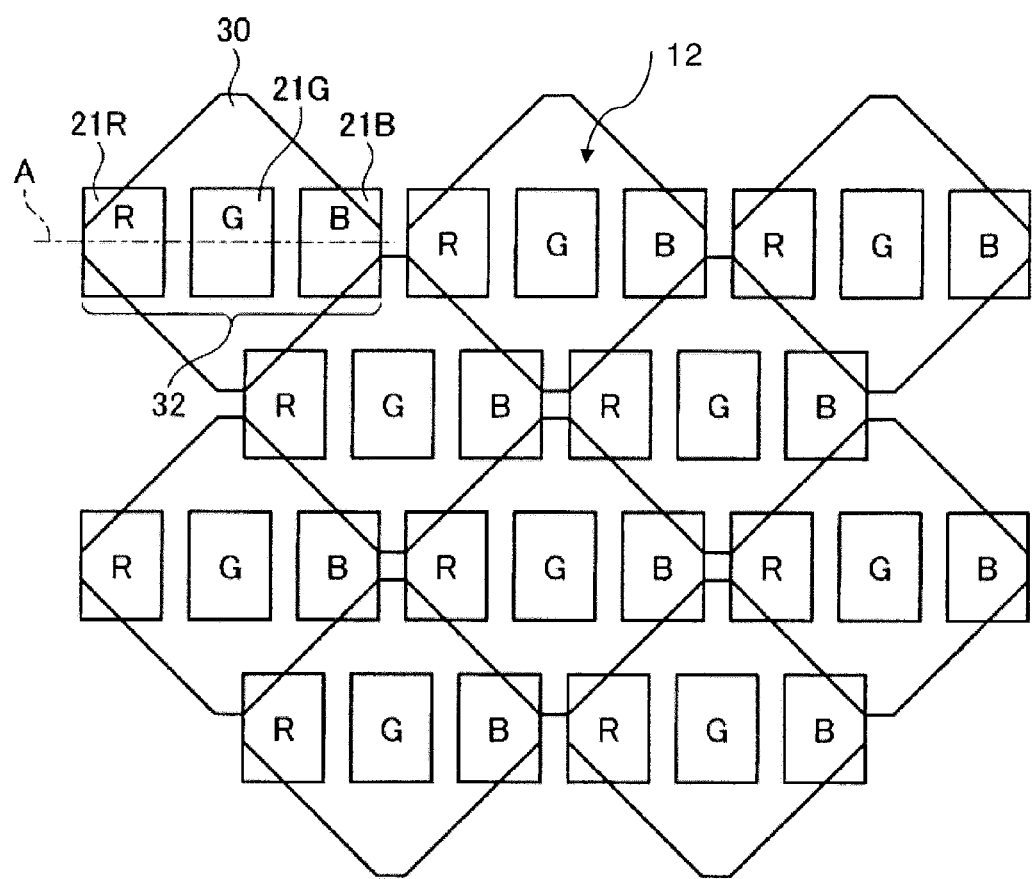
FIG. 3 shows a plan view of the microlens array and the photoelectric conversion element array of the image sensor of FIG. 1.

FIG. 3 shows a plan view of the microlens array and the photoelectric conversion element array of the image sensor 12 of FIG. 1. The image sensor 12 is shown as seen from the light incident side, together with the microlens array and the photoelectric conversion element array, which are located below the microlens array. Moreover, the dashed line A in FIG. 3 corresponds to the cross section shown in FIG. 1.

The horizontal direction on the page of FIG. 3 is regarded as the row direction, and the vertical direction is the column direction.

The photoelectric conversion elements 21R, 21G, and 21B, are offset relative to each other within the microlens array. For example, the photoelectric conversion elements 21R, 21G, and 21B are offset corresponding to half the length between the centers of each photoelectric conversion element 21R, 21G, and 21B in the column-wise direction, and are alternating differently for each column in a staggered arrangement. The combination of the three photoelectric conversion elements 21R, 21G, and 21B, which define a cell 32, is repeated in the row direction. Each cell 32 is offset in the column direction in alternating rows according to one quarter of the width of each of the photoelectric conversion elements 21R, 21G, and 21B. The photoelectric conversion elements 21R are mounted diagonally with respect to the row and column directions. Similarly, the photoelectric conversion elements 21R, 21G and 21B are positioned diagonally.

Each microlens 30 overlays an equivalent area of 3 photoelectric conversion elements 21R, 21G, and 21B, and preferably that area is the full area of a single conversion element such as conversion element 21G, a primary area of the adjacent conversion elements 21B and 21R, and a smaller area of conversion elements 21B and 21R in adjacent rows above and below full area of conversion element 21G. The cell 32 likewise includes 3 photoelectric conversion elements 21R, 21G, and 21B. The cell 32 contains the photoelectric conversion elements 21R, 21G, and 21B for the three different wavelength ranges (e.g., colors) of light. Each microlens 30 is thus arranged to primarily correspond to a cell 32. Each microlens 30 is arranged diagonally as the photoelectric conversion elements 21G, which is located at the center of the photoelectric conversion element 21G, and each microlens 30 is tilted relative to the row or column direction to form an array making a 45 degree angle relative to the microlens array.

Each microlens 30 has eight sides formed by cutting away the corners of the original square. Alternatively, each microlens 30 can have the form of a square with four rounded corners, or it can be a square, a diamond, or a circle in addition to the eight-sided shape.

Referring again to FIG. 1, a first reflection unit 25, second reflection unit 26 and a third reflection unit 27 serve to further reflect the light reflected by the wavelength-selective elements 22R, 22G and 22B. The first reflection unit 25 comprises the first reflection surface facing the wavelength-selective elements 22R, 22G, and 22B. An aperture that passes light from each microlens 30 is installed in the first reflection unit 25.

The aperture is located at or near the center of the microlens 30 and at or near the center of the photoelectric conversion element 21G to be between the microlens 30 and the photoelectric conversion element 21G. The first reflection unit 25 acts as a shielding layer to block light that enters the photoelectric conversion element array from the microlens array side, other than where the aperture is present. A lens 31 is formed in the aperture of the first reflection unit 25. The lens 31 in the layer acts as a parallel optical device to collimate the light focused by the microlens 30.

A first transparent layer 24 lies between the wavelength-selective elements 22R, 22G, 22B and the first reflection unit 25. The first transparent layer 24 transmits light. Considering a grouping of three photoelectric conversion elements 21G, 21B and 21R overlain by a single microlens 30 to form a cell 32, a second reflection unit 26 comprises a second reflecting surface which surrounds the portion of the first transparent layer 24 extending between the wavelength-selective elements 22R, 22G, 22B and the first reflection unit 25 in each of the cells 32. The second reflection unit 26 forms a light barrier that separates the first transparent layer 24 for each cell 32.

Figure 4:
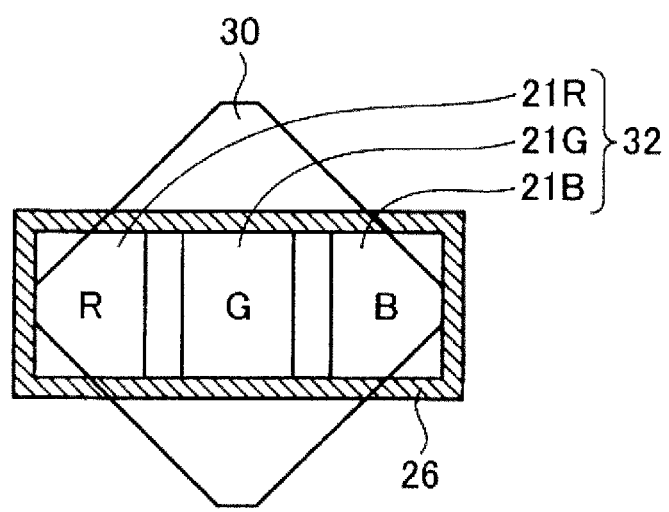
FIG. 4 is a plan view showing a cell of the image sensor of FIG. 1 arranged relative to a microlens.

FIG. 4 shows the arrangement of the second reflecting unit 26 when the image sensor 12 is seen from the incident side. The microlens 30 is shown with the photoelectric conversion elements 21R, 21G, 21B below it, and the second reflection unit 26 is shown surrounding the cell 32. The second reflection unit 26 forms the boundary of cell 32.

In the sectional view shown in FIG. 1, the end of the second reflection unit 26 is connected to a surface of the first reflection unit 25. The opposing end of the second reflection unit 26 is connected to the outermost separating reflective barrier 23 to form a sidewall that partitions the cell 32.

A third reflection unit 27 is formed on separating reflective barrier 23. The third reflection unit 27 isolates the adjacent wavelength-selective elements 22R, 22G, and 22B. The third reflection unit 27 comprises the third reflection surface that reflects the light which extends across the gap between adjacent wavelength-selective elements 22R, 22G, and 22B in each cell 32.

The first transparent layer 24 is completely surrounded by the wavelength-selective elements 22R, 22G, 22B, the first reflection unit 25, the second reflection unit 26 and the third reflection unit 27 in three dimensions except at the location of lens 31 in the layer of the first reflection unit 25.

The first reflection unit 25, second reflection unit 26 and the third reflection unit 27 include a highly reflective material with a metallic component such as aluminum and silicon dioxide ($SiO_2$) and a low optical refractive index. However, the composition of the reflecting units need not be as described in this embodiment. For instance, the reflecting unit may include only the first and second reflectors 25 and 26, the third one 27 being omitted. Moreover, the shape of the first reflecting unit 25, the second reflecting unit 26 and the third reflecting unit 27 can be changed. Each cell 32 adjacent the cell 32 includes the same structure, such that each individual cell has internally reflecting enclosure walls composed of the second reflection unit 26, the first reflection unit 25, the surfaces of the third reflection unit 27 and the partially reflecting surfaces of the elements 22R, 22G and 22B. Thus, light which enters this box or cavity is substantially constrained from leaving the box or cavity until it is absorbed by one of the photoelectric conversion elements 21R, 21G or 21B.

A second transparent layer 28 has been installed between microlens array and the first reflecting unit 25. The second transparent layer 28 passes the light from the microlens 30 to lens 31 in the layer. The first transparent layer 24 is composed of a transparent material such as titania ($TiO_2$) with a high optical refractive index. The second transparent layer 28 is composed of a transparent material such as silicon dioxide ($SiO_2$) with a low optical refractive index.

Figure 5:
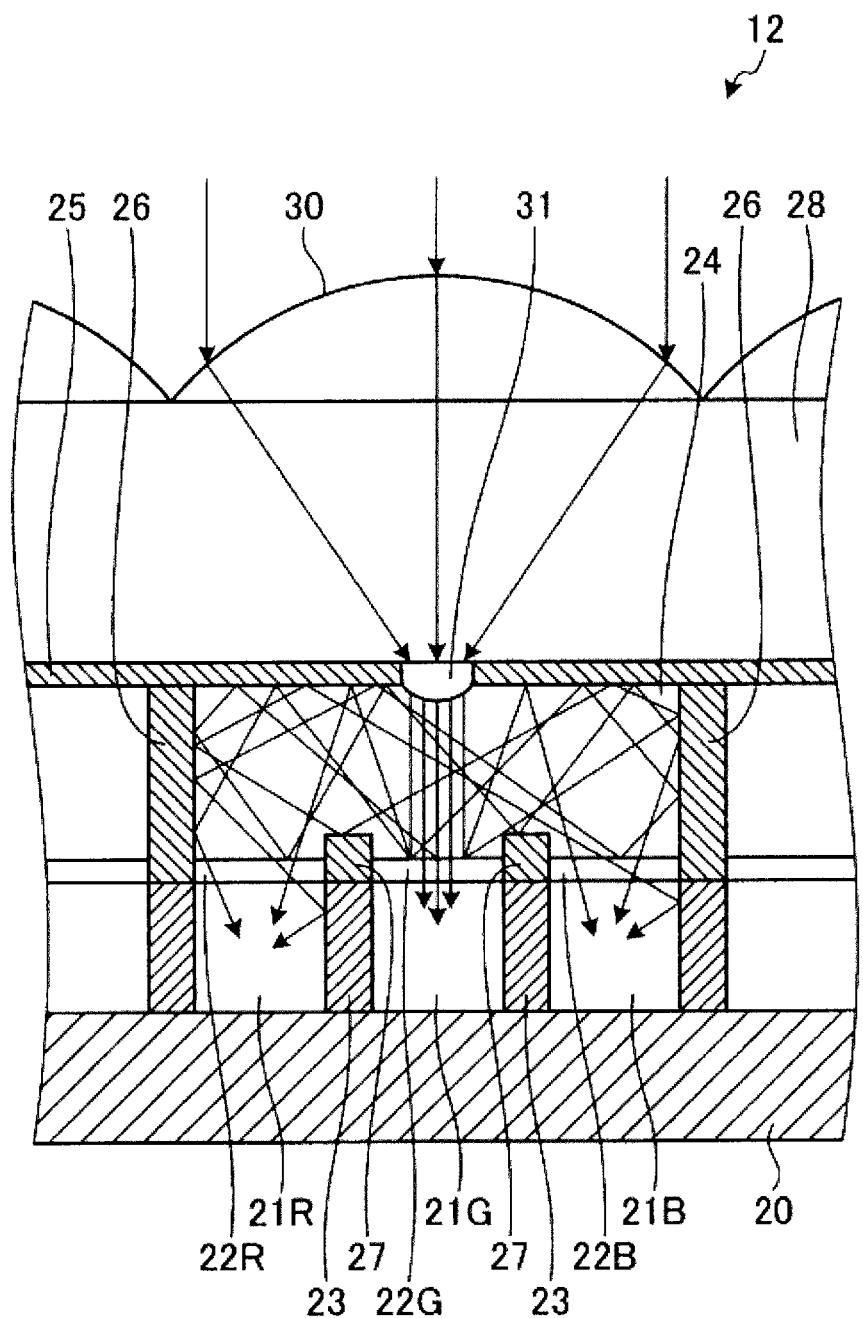
FIG. 5 is a schematic diagram illustrating an example of the behavior light within the image sensor.

FIG. 5 shows the behavior of the light incident on the image sensor 12. The microlens 30 focuses the incident light from an imaging optical system 11 (FIG. 2) to the lens 31 in the layer. The lens 31 collimates the light from the microlens 30. The light incident from the lens 31 in the layer goes in the first transparent layer 24 to the wavelength-selective element 22G. The image sensor 12 can efficiently separate the colors by using the wavelength-selective element 22G transmitting light and reflecting light.

The wavelength-selective element 22G transmits the G component of the incident light and reflects the R and B components. The G light passed by the wavelength-selective element 22G is converted into an electric charge by the photoelectric conversion element 21G. The light reflected by the wavelength-selective element 22G propagates in the first transparent layer 24. The first reflecting unit 25, second reflecting unit 26 and the third reflecting unit 27 reflect the incident light, which propagates in the first transparent layer 24. Light reflected from any of the wavelength-selective elements 22B, 22G or 22R becomes trapped within the reflecting box like structure of the reflecting walls, to eventually meet with, and pass through, one of the three wavelength-selective elements appropriate for that light. In that way, although a wavelength-selective element overlies the photoelectric conversion elements, the elements do not significantly attenuate the light received thereby in non-selected wavelengths, but instead reflect that light for receipt elsewhere in the cell, increasing the quantity of the incident light which is converted to an electrical signal corresponding to R, G and B light.

The wavelength-selective element 22R passes the R component of the incident light and reflects the G and B components. The R light passed by the wavelength-selective element 22R is converted into an electric charge by the photoelectric conversion element 21R. The light reflected by the wavelength-selective element 22R propagates further in the first transparent layer 24.

The wavelength-selective element 22B passes the B component of the incident light and reflects the R and G components. The B light passed by the wavelength-selective element 22B is converted into an electric charge by the photoelectric conversion element 21B. The light reflected by the wavelength-selective element 22B continues to propagate in the first transparent layer 24.

When the light is obliquely incident on the receiving surface of the photoelectric conversion elements 21R, 21G, and 21B and passes into the photoelectric conversion elements 21R, 21G, and 21B, the reflective barrier 23 reflects the light, so the transmission of the other photoelectric conversion elements 21R, 21G, or 21B is controlled. The image sensor 12 can control the generation of the color mixture by controlling the leakage of light between adjacent photoelectric conversion elements 21R, 21G, and 21B by means of the reflective barrier 23.

The wavelength-selective elements 22R, 22G, and 22B in the image sensor 12 can be easily manufactured by the same process used for the wavelength-selective elements on the light-receiving surface of conventional photoelectric conversion elements. The manufacturing cost of the image sensor 12 can be controlled by using the wavelength-selective elements 22R, 22G, and 22B for color separation.

Wavelength ranges of colors other than the wavelength range of the color transmitted to the photoelectric conversion elements 21R, 21G, 21B is reflected by the image sensor 12 and directed to the other photoelectric conversion elements 21R, 21G and 21B. The image sensor 12 can improve the light use efficiency as the light is contained in the first transparent layer 24 in each cell 32. In addition, the image sensor 12 can produce R, G, and B signals with good color reproducibility by decreasing the dependence on the angle of incidence.

The reflecting unit surrounding the first transparent layer 24 in each cell 32 is installed in the image sensor 12, and after being reflected by the wavelength-selective elements 22R, 22G, and 22B, the light is reflected in the reflecting unit. The image sensor 12 transmits the light which is reflected by the wavelength-selective element 22R, 22G, and 22B to the wavelength-selective elements 22R, 22G, and 22B by means of the reflecting unit, which promotes efficient light utilization.

The image sensor 12 can obtain the information on each color component of R, G, and B from each cell 32 by reproducing the composition, in which a microlens 30 corresponds to each cell 32 which contains the photoelectric conversion elements 21R, 21G, and 21B for each color R, G and B. The image sensor 12 can acquire the color image by reading the color component information for each microlens 30 without interpolating the signal representative of each color component. The image sensor 12 can produce a high-quality image in which the false color is greatly decreased by bypassing color interpolation.

The green spectral region in the intermediate wavelength range of visible light corresponds to peak sensitivity of the human eye. This G component among R, G and B components greatly affects the visibility of the image. The image sensor 12 especially decreases the loss of G light by placing the photoelectric conversion element 21G at the position where the light travels straight from the microlens 30. The image sensor 12 maintains the resolution and signal to noise ratio (SNR) of the G component at an increased level by decreasing the loss of G light, which ensures high resolution and low noise in the image.

Figure 6:
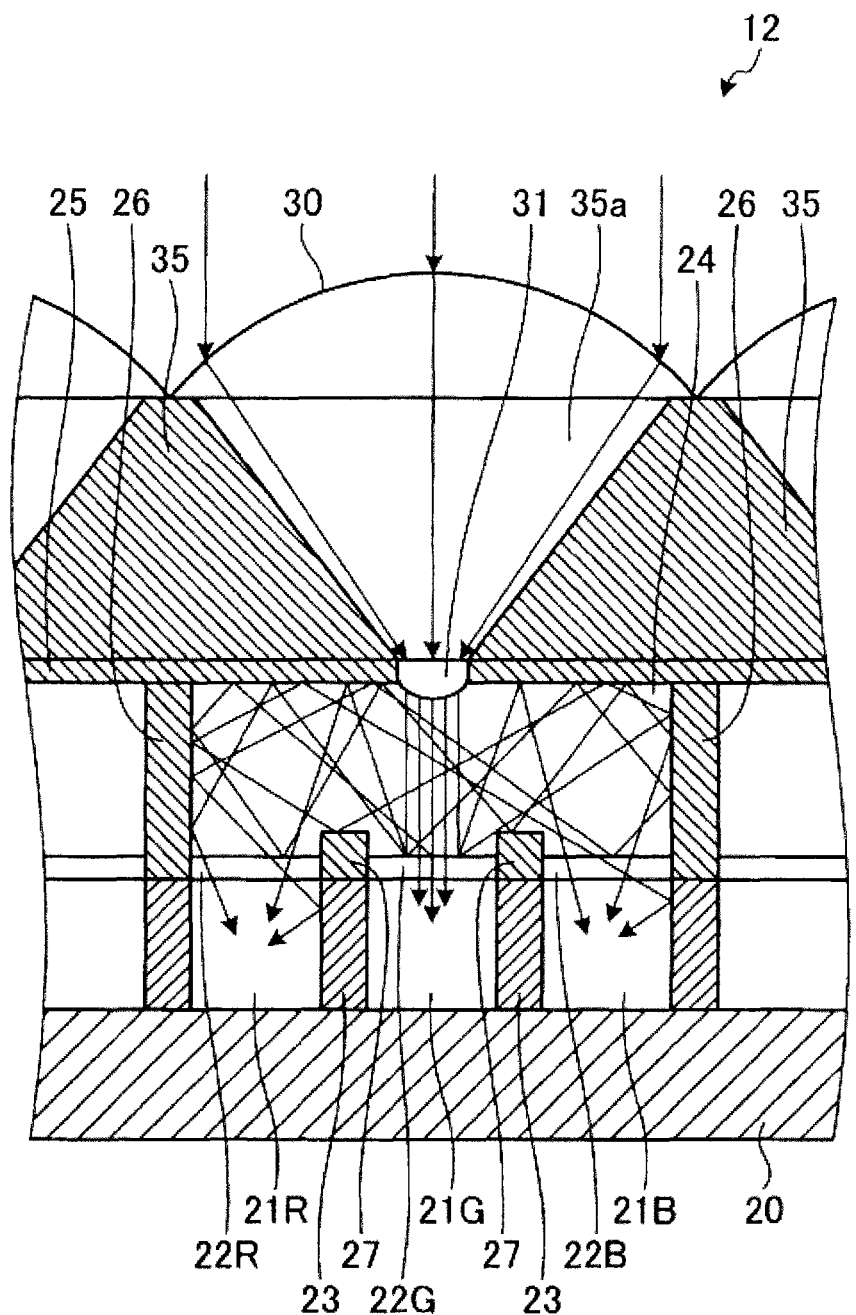
FIG. 6 is a schematic cross-sectional diagram showing a portion of an image sensor according to another embodiment.

FIG. 6 shows a cross-section of a portion of an image sensor 12 according to another embodiment. A fourth reflecting unit 35 has been installed between the microlens 30 and the first reflecting unit 25. A third transparent layer 35a forms a gradually narrowed pyramid shape (i.e., cone-shaped) that directs light from the microlens 30 toward the aperture of the first reflecting unit 25.

The fourth reflecting unit 35 fills the space between the third transparent layer 35a, lying below the microlens 30, and above the first reflecting unit 25. The fourth reflecting unit 35 comprises the fourth reflecting surface that reflects the light in the layer 35a between the microlens 30 and the first reflecting unit 25 toward the lens 31.

The fourth reflecting unit 35 is composed of a highly reflective metallic material, such as aluminum and silicon dioxide ($SiO_2$) with low optical refractive index. The third transparent layer 35a is composed of titania ($TiO_2$) with a high optical refractive index. The high reflectivity material can be used in the fourth reflecting unit 35 even when the part between the third transparent layers 35a is not filled, such as by extending a reflective material between the perimeter of microlens 30 and the perimeter of lens 31. Preferably, however, the interface of the fourth reflecting unit 35 with the third transparent layer 35a is composed of at least one of the high reflectivity materials. The fourth reflecting unit 35 can be formed with the first reflecting unit 25 as an integral part of the first reflecting unit 25.

Light traveling from the microlens 30 in directions other than toward the lens 31 in the layer is directed to lens 31 by reflection of that light off of the conical walls of the fourth reflecting unit 35. The image sensor 12 of FIG. 6 efficiently passes the light from the microlens 30 to lens 31 in the layer by reflection by the fourth reflecting unit 35, thereby improving light use efficiency.

Figure 7:
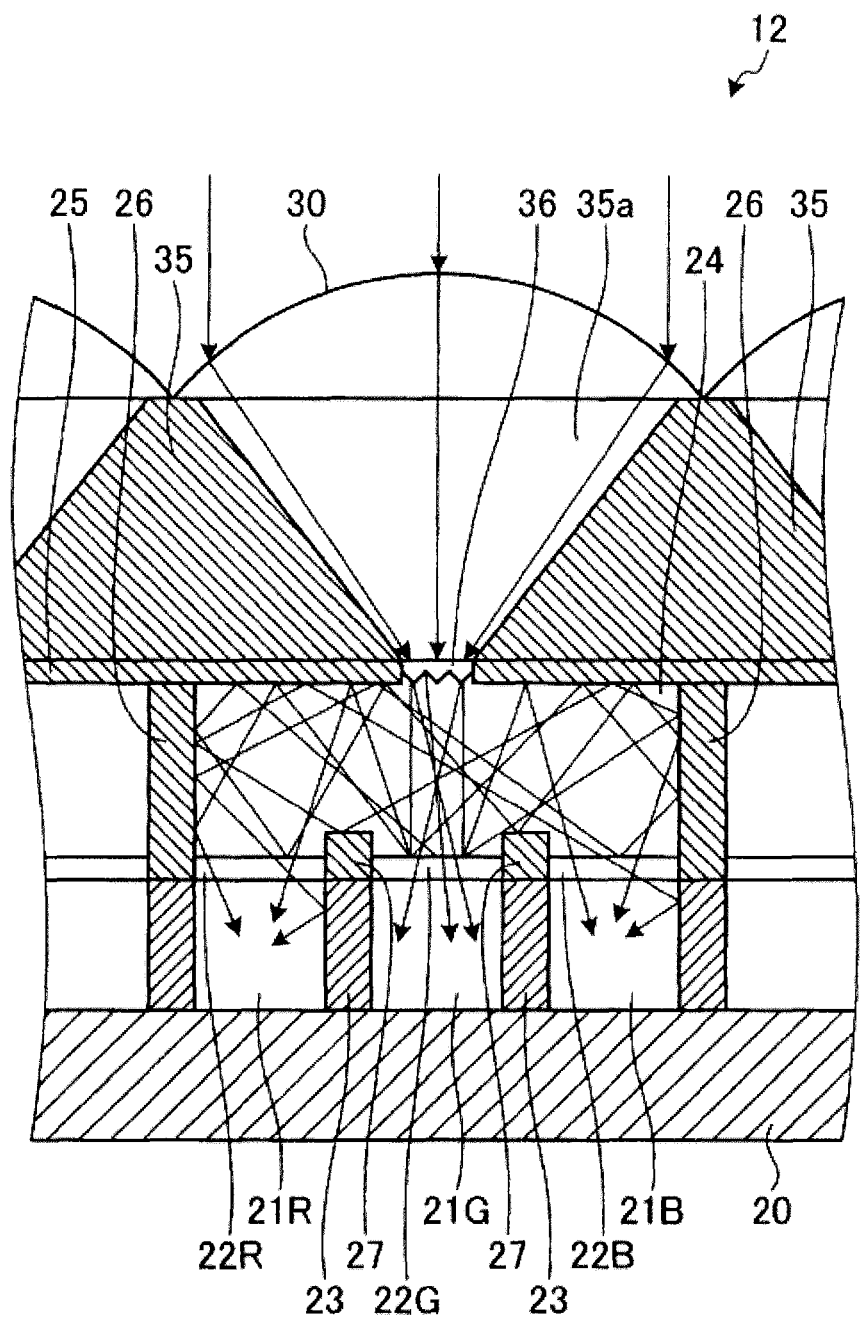
FIG. 7 is a schematic cross-sectional diagram showing a portion of a solid-state image sensor according to another embodiment.

FIG. 7 shows a cross-sectional view of an image sensor 12 according to another embodiment. A diffusion unit 36 which spreads the light angularly by its wavelength is installed in the aperture of the first reflecting unit 25 in the place of the lens 31 in the layer. The diffusion unit 36 diffuses the light which is to be collected by microlens 30 after it enters the cell 32. After light passes through the lens 31 toward the wavelength-selective elements, the components thereof reflected by the wavelength-selective element 22G are reflected by the angled surfaces of the diffusion unit 36 and are reflected back within the boundary of the cell 32. In this modified example, the light of the component reflected by the wavelength-selective element 22G is effectively diffused in directions away from the aperture of the first reflecting unit 25, so the ejection of light back through the aperture into the region of the third transparent layer 35a can be significantly reduced. For instance, the diffusion unit 36 can be implemented as a triangular pyramidal structure composed of titania (TiO$_2$) with a high optical refractive index.

Figure 8:
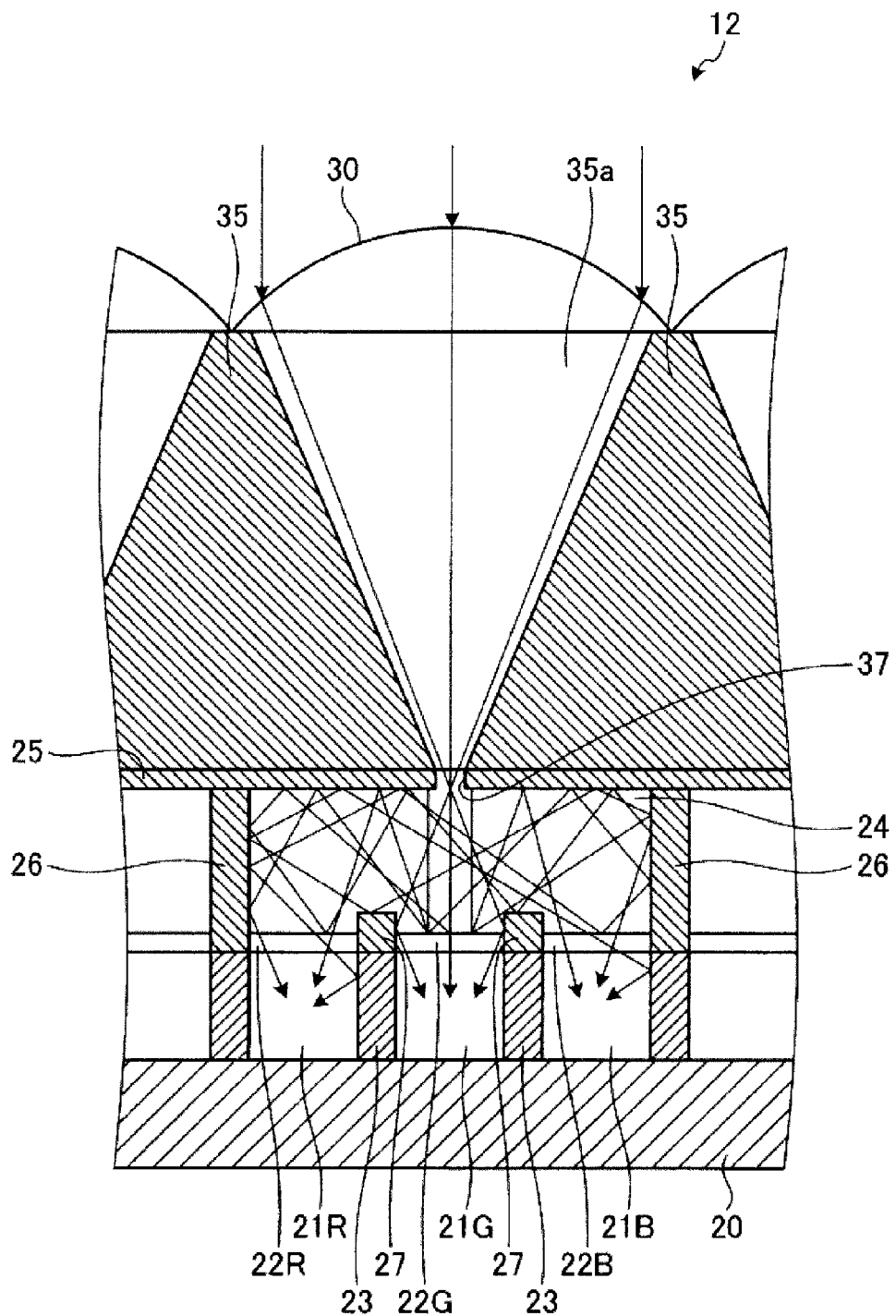
FIG. 8 is a schematic cross-sectional diagram showing a portion of a solid-state image sensor according to another embodiment.

FIG. 8 shows a cross-sectional view of an image sensor 12 according to another embodiment. The microlens 30 focuses the light to an aperture 37 of the first reflecting unit 25. However, an optical element is not positioned in the aperture 37. The light focused at the aperture 37 is diffused as-is. As for microlens 30, the light collection rate is set so that the light focused at the aperture 37 can diffuse throughout the spectral range passed by the wavelength-selective element 22G. In other words, light entering the cell 32 enters at a plurality of angles. However, by aligning the slope of the conical wall (s) of the fourth reflecting unit 35 to align, if extended inwardly of the cell, to opposed etremi of the photoelectric conversion element directly beneath the aperture, in this embodiment 21G, the majority of light entering the cell 32 area is initially received at the surface of wavelength-selective element 21G, and allowed to pass through or is reflected based upon its wavelength. The reflected light is then reflected within the walls of the cell, until it reaches the appropriate wavelength-selective element through which it may pass. In FIG. 8, just as for the embodiment of FIG. 7, the light of the component reflected by the wavelength-selective element 22G can be effectively diffused in directions away from the aperture 37 and light injection from the aperture 37 into the third transparent layer 35a can be controlled. Just as in the case of the image sensor 12, by omitting the optical element in the aperture 37, one can decrease the parts required, and thus the manufacturing cost of the image sensor 12.

Moreover, in FIGS. 7 and 8, the fourth reflecting unit 35 can be formed in the image sensor 12 as described in FIG. 6. The fourth reflecting unit 35 can also be omitted in the image sensor 12 in FIGS. 7 and 8.

Figure 9:
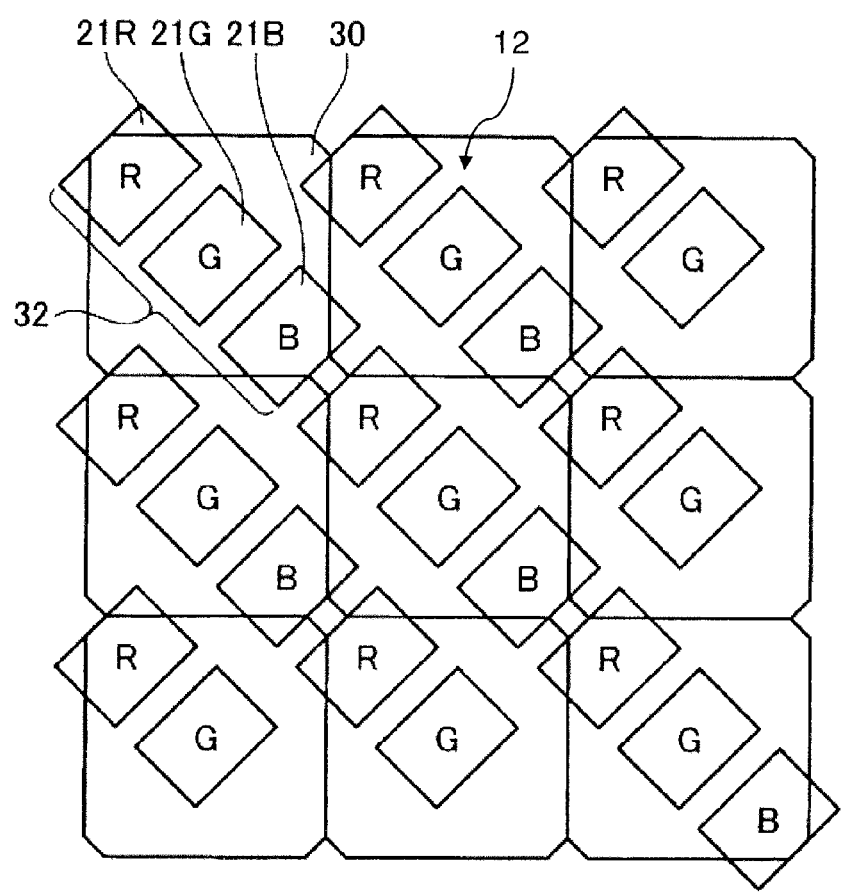
FIG. 9 is a plan view of another embodiment of a microlens array and photoelectric conversion element array.
Figure 10:
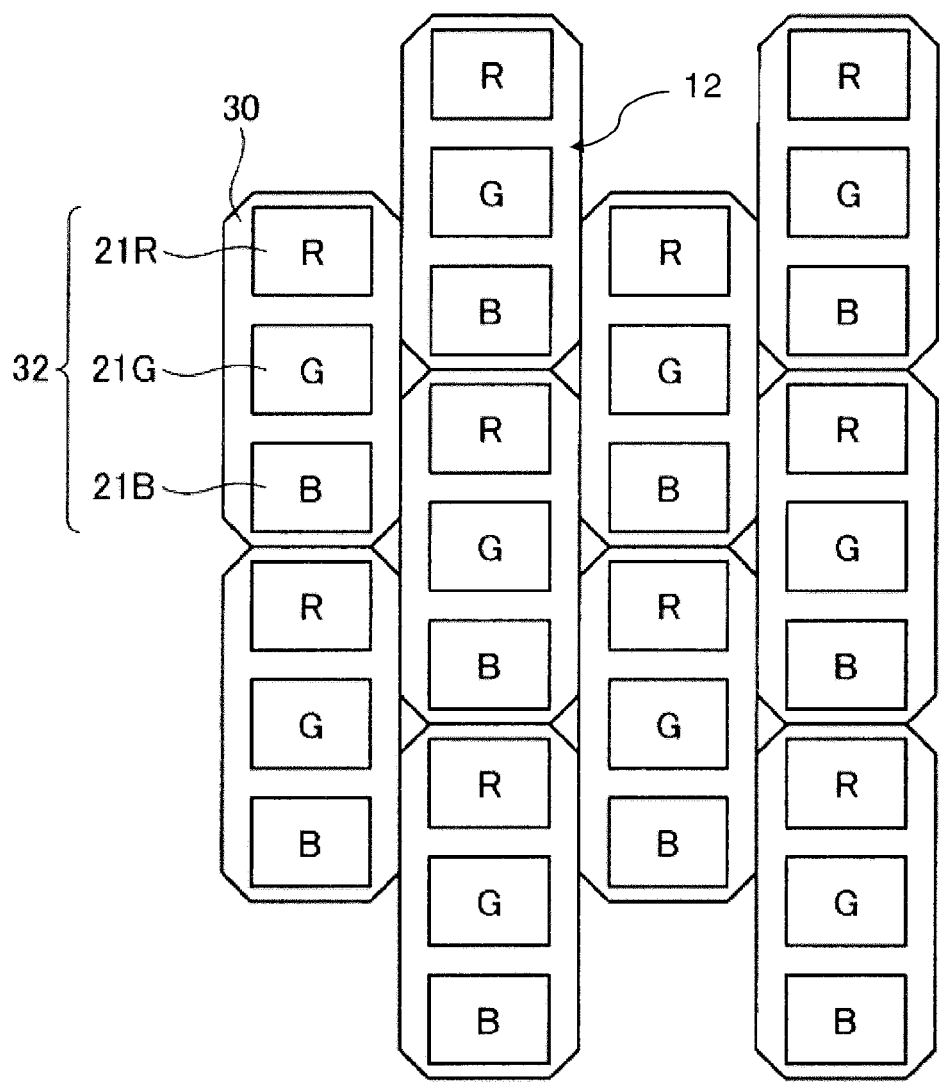
FIG. 10 is a plan view of another embodiment of a microlens array and photoelectric conversion element array.
Figure 11:
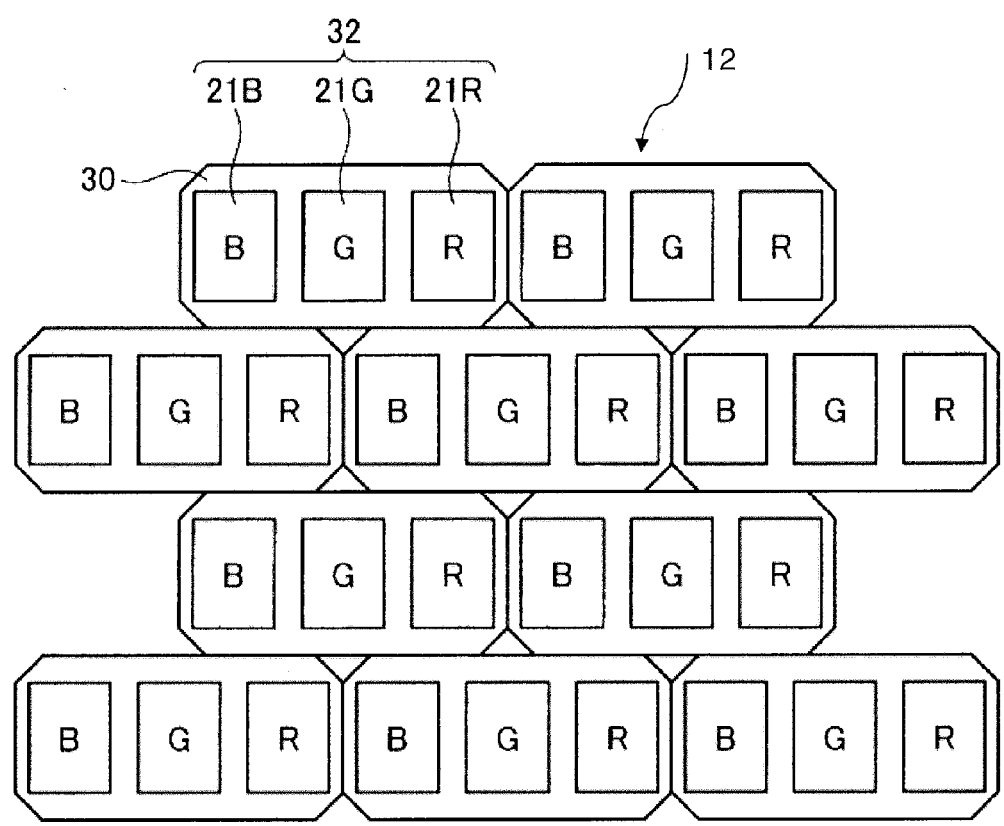
FIG. 11 is a plan view of another embodiment of a microlens array and photoelectric conversion element array.

In the embodiments, the composition of the microlens array and the photoelectric conversion element array which are shown in FIG. 3 can be changed if needed. FIG. 9~FIG. 11 show some modified examples of the microlens and photoelectric conversion element arrays. In the modified example shown in FIG. 9, the microlens 30 forms a square array. Here the photoelectric conversion elements 21R, 21G, and 21B form an array making a 45 degree angle relative to the square array shown in the FIG. 3.

In the modified example shown in FIG. 10, the cell 32 is oriented along the column direction. As in the case of the photoelectric conversion elements 21R, 21G, and 21B, the columns are arranged so that their vertical offsets are staggered by half the height of a cell. Each microlens 30 has eight sides obtained by cutting away the four corners of a square, with the long sides along the column direction. Each microlens 30 is oriented in the column direction to correspond to a cell 32.

In the modified example shown in the FIG. 11, the array shown in FIG. 10 is rotated by 90 degrees and the cells 32 are oriented in the row direction. Like the photoelectric conversion elements 21R, 21G, and 21B, the rows are staggered with a horizontal offset equal to one half the cell width. Each microlens 30 has eight sides formed by cutting away the four corners of a square, with the long sides along the row direction. Each microlens 30 is oriented along the row direction to correspond to cell 32.

With the microlens 30 and photoelectric conversion elements 21R, 21G, and 21B arranged as in these modified examples, high-quality images can be obtained in the same way as in the case where the image sensor 12 is arranged as shown in FIG. 3. In the modified examples shown in FIG. 10 and FIG. 11, the microlens 30 can be rectangular with four straight or rounded corners, or elliptical.

Second Embodiment

Figure 12:
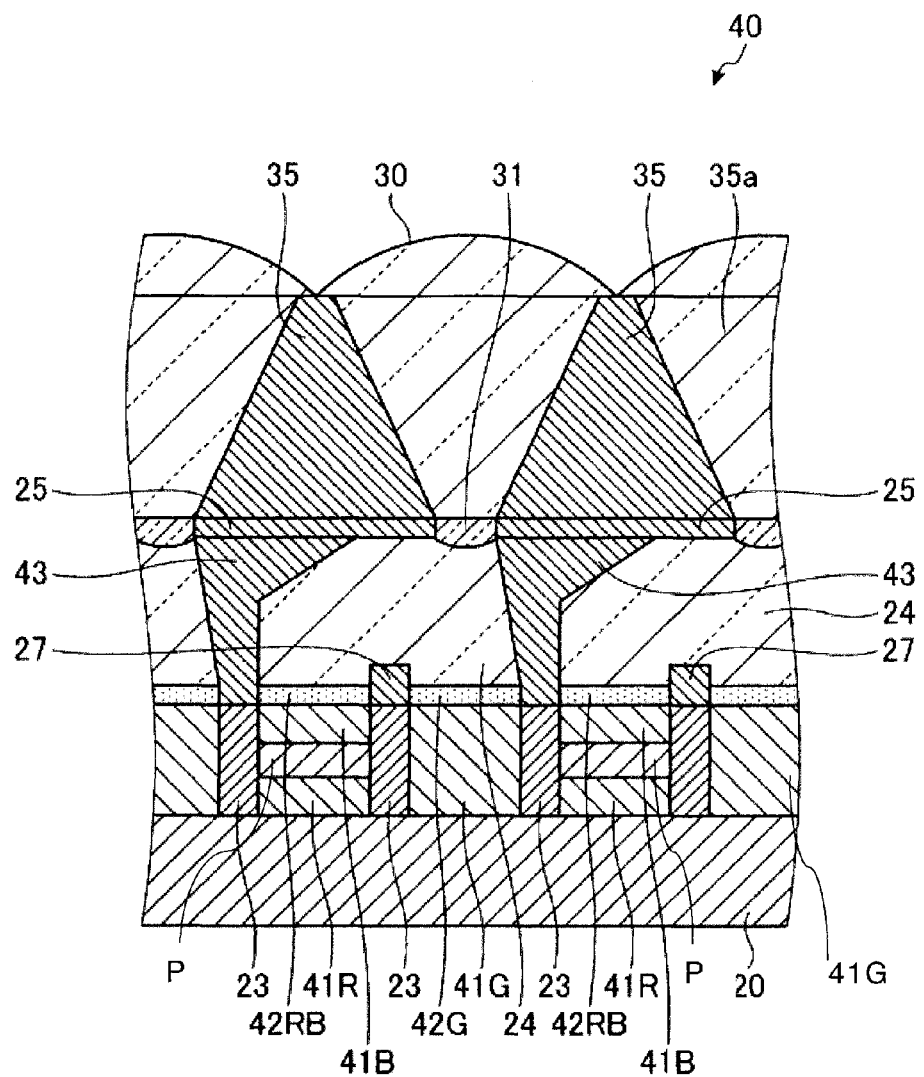
FIG. 12 is a schematic cross-sectional diagram showing a portion of a solid-state image sensor according to another embodiment.

FIG. 12 schematically shows a cross-section of a portion of an image sensor 40 according to another embodiment. The components are labeled in the same way as in the first embodiment and explanation thereof is omitted for brevity.

A plurality of photoelectric conversion elements 41R, 41G, and 41B are N-type photodiodes on a P-type semiconductor substrate 20. In this embodiment, the 41R photoelectric conversion element is located below, i.e., further within the substrate 20, and is overlain by, photoelectric conversion element 41B. A P-type layer P is interposed between the photoelectric conversion elements 41R and 41B. The photoelectric conversion element 41G is adjacent to the layered structure of the photoelectric conversion elements 41R and 41B, separated therefrom by the separating reflective barrier 23.

The photoelectric conversion element 41R detects R light, which is the first color. The photoelectric conversion element 41B detects B light, the second color. The photoelectric conversion element 41G detects G light, the third color. In the layered structure of the photoelectric conversion elements 41R and 41B, the incident side of the photoelectric conversion element 41B facing the photoelectric conversion element 41R is laminated.

The wavelength-selective element 42G is located on the light receiving side of the photoelectric conversion element 41G. The wavelength-selective element 42G passes G light, the color detected by the photoelectric conversion element 41G, and reflects R and B light, the other colors. The wavelength-selective element 42G is a wavelength-selective element for the third color light. A color selective element 42RB overlies photoelectric conversion element 41B. The element 42RB allows the wavelengths of light corresponding to the absorption ranges of photoelectric conversion elements 41B and 41R to pass therethrough, but reflects other colors.

Figure 13:
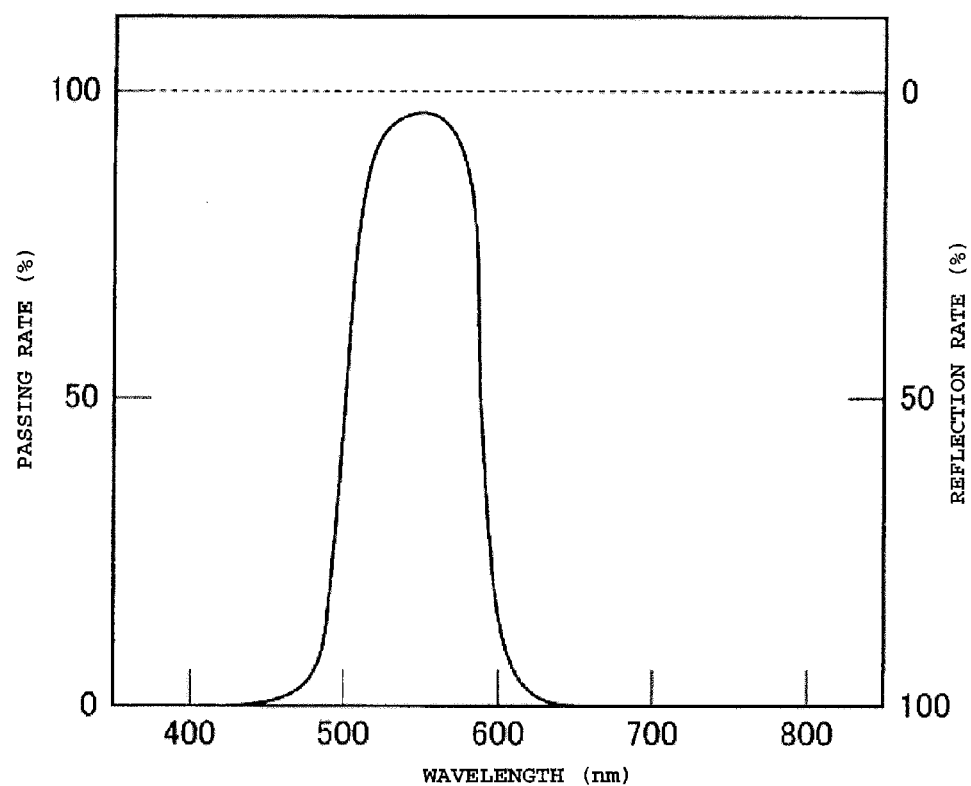
FIG. 13 is a graph showing the spectral characteristic of the wavelength-selective element for G light.

FIG. 13 shows an example of the spectral characteristic of the wavelength-selective element for G light. The wavelength-selective element 42G passes G light from 490 nm to 580 nm, and reflects B light of 490 nm or less and R light of 580 nm or more. Here, the wavelength shown is chosen as half the wavelength at which about 50% of the light is passed by the element.

The wavelength-selective element 42RB is located on the light-receiving side of the photoelectric conversion element 41B. The wavelength-selective element 42RB passes the R light which is to be detected in photoelectric conversion element 41R and the B light which is to be detected in the photoelectric conversion element 41B, and reflects the G light. The wavelength-selective element 42RB directs the R and B light to the layered structure which includes the photoelectric conversion elements 41R and 41B.

Figure 14:
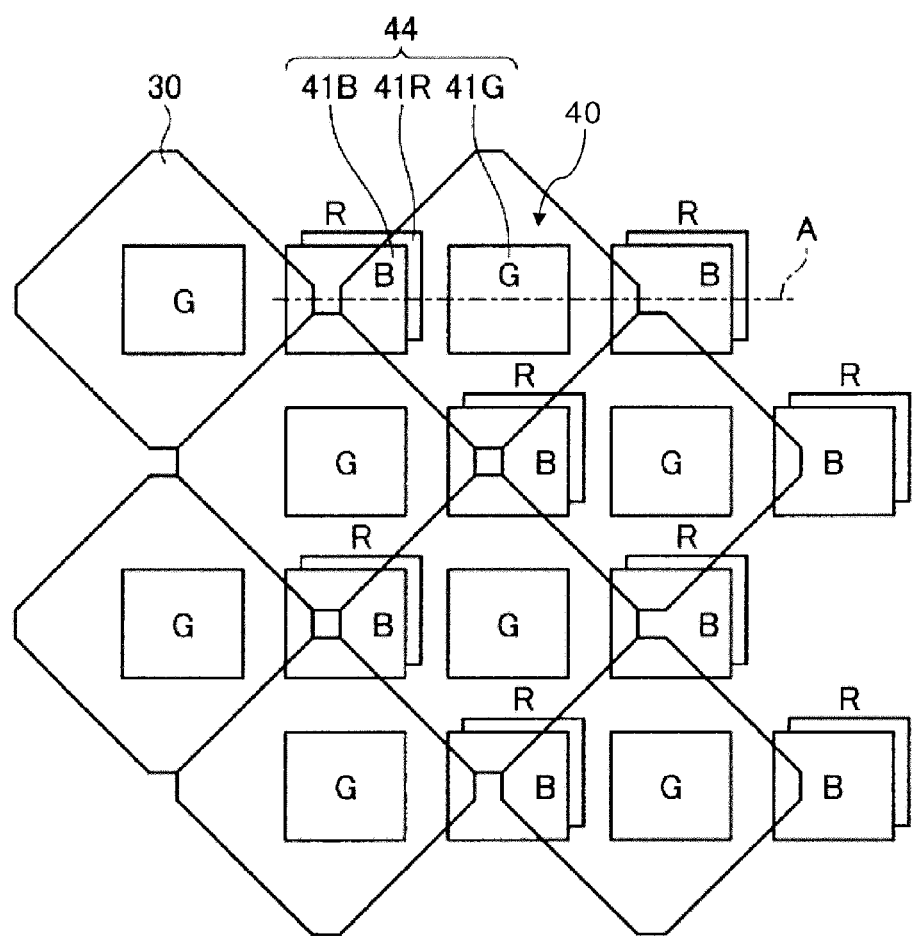
FIG. 14 is a plan view of one embodiment of a microlens array positioned relative to a photoelectric conversion element array.

FIG. 14 is a schematic plan view of a microlens array and a schematic chart of a planar photoelectric conversion element array positioned below the microlens array. Here, the image sensors 40 comprise a cell 44 (consisting of one photoelectric conversion element 41R, one photoelectric conversion element 41G, and one photoelectric conversion element 41B) are viewed at a slight oblique angle from the incident side and the microlens 30 and the photoelectric conversion elements 41R, 41G, and 41B located below microlens 30 are shown. The cross section shown in FIG. 12 corresponds to the cross section shown by the dashed line A in FIG. 14.

The layered structure which includes the photoelectric conversion element 41G, and photoelectric conversion elements 41R and 41B is arranged to form a square array. The combination which includes the three photoelectric conversion elements 41R, 41G, and 41B is repeated in the row direction. The cell 44 contains three photoelectric conversion elements 41G, 41B and 41R.

As with the microlens array, each microlens 30 is arranged so that the position of the photoelectric conversion element 41G is centered. The microlens 30 contains a central photoelectric conversion element 41G and the photoelectric conversion elements 41B that are adjacent in the row and column directions. The area of the microlens 30 is about two pixels. The resulting image sensor 40 corresponds to a single microlens 30 with a combination of photoelectric conversion elements 41R, 41G, and 41B for each color.

The photoelectric conversion element 41G is aligned diagonally with respect to the row and column directions. Similarly, the bi-layered structure of the photoelectric conversion elements 41R and 41B is also diagonally aligned. The microlenses 30 form an array inclined by 45 degrees relative to the square array by aligning them diagonally in the same direction as the photoelectric conversion elements 41G at the center.

Referring again to FIG. 12, the first reflecting unit 25, the second reflecting unit 43 and the third reflecting unit 27 function as a reflector that further reflects the light after reflection by the wavelength-selective elements 42G, 42RB. As in the second reflecting unit 43, the first transparent layer 24 between the wavelength-selective elements 42G, 42RB, and the first reflecting unit 25 is surrounds each cell 44. The first transparent layer 24 is separated in each cell 44 by the second reflecting unit 43.

The edges of the second reflecting unit 43 are connected to the first reflecting unit 25 in the cross section shown in FIG. 12. The edges of the side of the second reflecting unit 43 opposite the first reflecting unit 25 are connected to the separating reflective barrier 23. Thus, each cell 44 containing three photoelectric conversion elements 41G, 41B and 41R are separated by the first reflecting unit 25 and the second reflecting unit 43, and each cell 44 shares a side of the second reflecting unit 43.

A sidewall unit is formed by the part of the second reflecting unit 43 that touches the wavelength-selective element 42RB and the first reflecting unit 25. An upper portion of the second reflecting unit 43 is angled to form a slanting surface above the sublevel in the sidewall. The surface of the second reflecting unit 43 that touches the wavelength-selective element 42G is slightly inwardly inclined relative to the plane of the wavelength-selective filter 42G.

The second reflecting unit 43 is composed of highly reflective materials, such as metallic aluminum or silicon dioxide ($SiO_2$) with low optical refractive index. Preferably, the interface of the second reflecting unit 43 with the first transparent layer 24 should be composed of at least one highly reflective material. The second reflecting unit 43 can be combined with the first reflector 25 to form a single unit.

Figure 15:
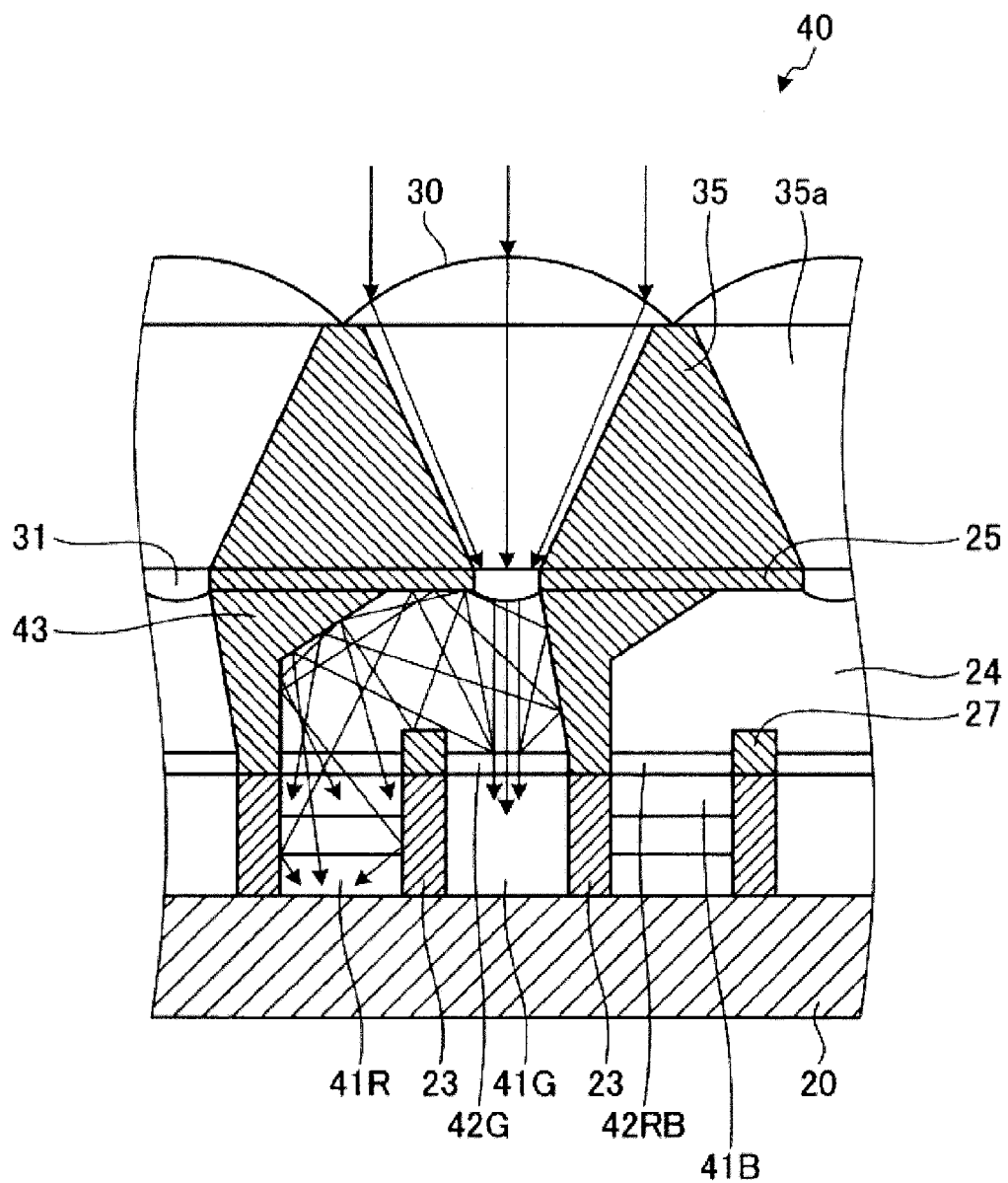
FIG. 15 is a schematic diagram illustrating an example of the behavior of the light within an embodiment of the image sensor.

FIG. 15 is a diagram showing an example of the behavior of light incident on the image sensor 40. The microlens 30 focuses the incident light from the imaging optical system 11 (FIG. 2) to lens 31 in the layer. The light injected from the lens 31 into the layer propagates into the first transparent layer 24 toward the wavelength-selective element 42G.

The wavelength-selective element 42G transmits the G component of the incident light, and reflects the R and B components. The G light passing the wavelength-selective element 42G is converted into an electric charge by the photoelectric conversion element 41G. The light reflected by the wavelength-selective element 42G continues to propagate in the first transparent layer 24. The first reflecting unit 25, the second reflecting unit 43 and the third reflecting unit 27 reflect the incident light, which propagates further into the first transparent layer 24.

The wavelength-selective element 42RB passes the R and B components of the incident light and reflects the G component. The wavelength-selective element 42RB works as a wavelength-selective element for the first color and for the second color of the light. The B light that passes the wavelength-selective element 42RB is converted into an electric charge by the photoelectric conversion element 41B. The R light passing the wavelength-selective element 42RB reaches the photoelectric conversion element 41B and the P-type layer formed between the photoelectric conversion element 41B and the photoelectric conversion element 41R, and is converted into an electric charge by the photoelectric conversion element 41R.

As in the second reflecting unit 43, light blocked by the wavelength-selective element 42G is efficiently redirected to the wavelength-selective element 42RB by properly setting the slanting surface of the second reflecting unit 43. Moreover, the shape of the second reflecting unit 43 can be adjusted. For example, the second reflecting unit 43 may not include an angled surface such that the sidewall is substantially planar in a vertical direction similar to the embodiment of the second reflecting unit 26 of FIG. 1.

By using the wavelength-selective elements 42G and 42RB as the basis for color separation, the image sensor 40 can reduce manufacturing costs. The image sensor 40 promotes the effective utilization of light by using a reflector that encloses the first transparent layer 24 in each cell 44. As a result, the image sensor 40 of the embodiment can record highly sensitive images by using light more efficiently as well as reduce manufacturing costs.

The image sensor 40 ensures a wide light receiving surface for each photoelectric conversion element 41R, 41G, and 41B as compared to the case where the photoelectric conversion elements 41R, 41G, and 41B are arranged in a linear, side-by-side direction, by using a bi-layered structure for the photoelectric conversion elements 41B and 41R. The image sensor 40 increases the saturated electron number, improves the light utilization efficiency, and provides a larger manufacturing margin for the photoelectric conversion elements 41R, 41G, and 41B.

The image sensor 40 separates the G component of the intermediate wavelength region among each color component R, G and B, and the P type layer is put between the photoelectric conversion elements 41B and 41R, which are made of two layers. As a result, the image sensor 40 can effectively suppress the decrease in the color separation due to the repetition of the spectral characteristics as compared to the case where the photoelectric conversion element 41G is put between photoelectric conversion elements 41B and 41R in a side-by-side orientation.

Figure 16:
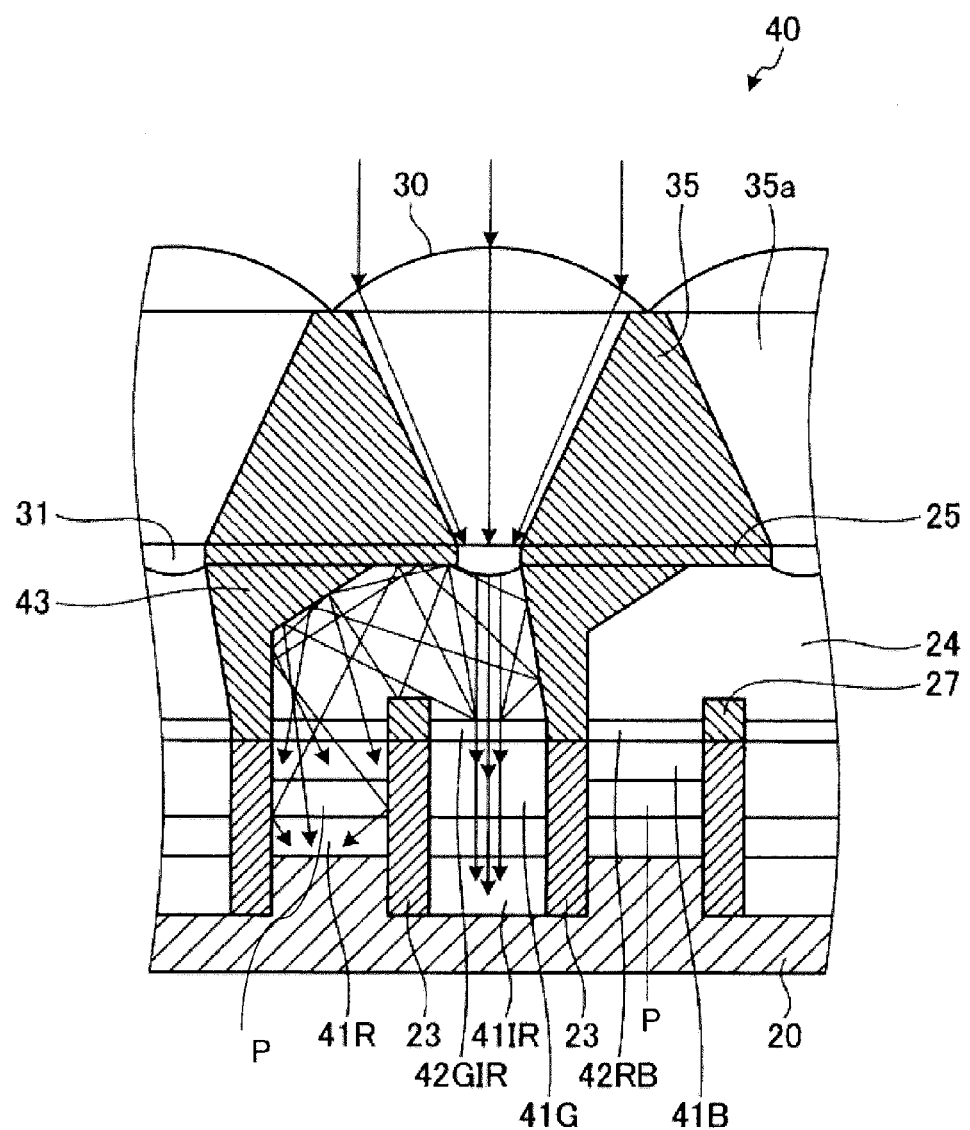
FIG. 16 is a schematic cross-sectional view of another embodiment of a solid-state image sensor as well as an example of the behavior of light in the image sensor.

FIG. 16 is a schematic cross-sectional view of another embodiment of an image sensor 40. The image sensor 40 includes photoelectric conversion elements 41IR which are N-type photodiodes. The photoelectric conversion element 41IR detects infrared (IR) light.

An IR blocking element, which removes the IR component from the light provided to the image sensor 40, is not mentioned in the description of the camera module 10a in FIG. 2. However, when other image sensors 12 and 40 described herein are used in the camera module 10a, an IR element for blocking IR light from the light reaching the image sensor 40 is built into the camera module 10a. In the embodiment shown in FIG. 16, no IR filter would be necessary in the camera module 10a as the image sensor 40 is adapted to detect IR wavelengths.

A photoelectric conversion element 41G and 41IR forms a bi-layered structure by which the P-type layer P is formed therebetween. The photoelectric conversion element 41G is an N-type layer on the surface of the P-type layer P. The photoelectric conversion element 41IR is an N-type layer formed on the opposing surface of the P-type layer P. In the bi-layered structure of the photoelectric conversion elements 41G and 41IR, the photoelectric conversion elements 41G are laminated from the photoelectric conversion elements 41IR to the incident side. The bi-layered structure of the photoelectric conversion elements 41G and 41IR adjoins the bi-layered structure of the photoelectric conversion elements 41R and 41B, which are separated by the reflective barrier 23.

The wavelength-selective element 42GIR is on the light-receiving side of the photoelectric conversion element 41G. The wavelength-selective element 42GIR passes both the G light which is to be detected in the photoelectric conversion element 41G and the IR light to be detected in the photoelectric conversion element 41IR, and reflects the R and B light. The wavelength-selective element 42GIR also acts as a filter for light of the third color. The wavelength-selective element 42GIR passes the G and IR light to the layered structure including the photoelectric conversion elements 41G and 41GIR.

Figure 17:
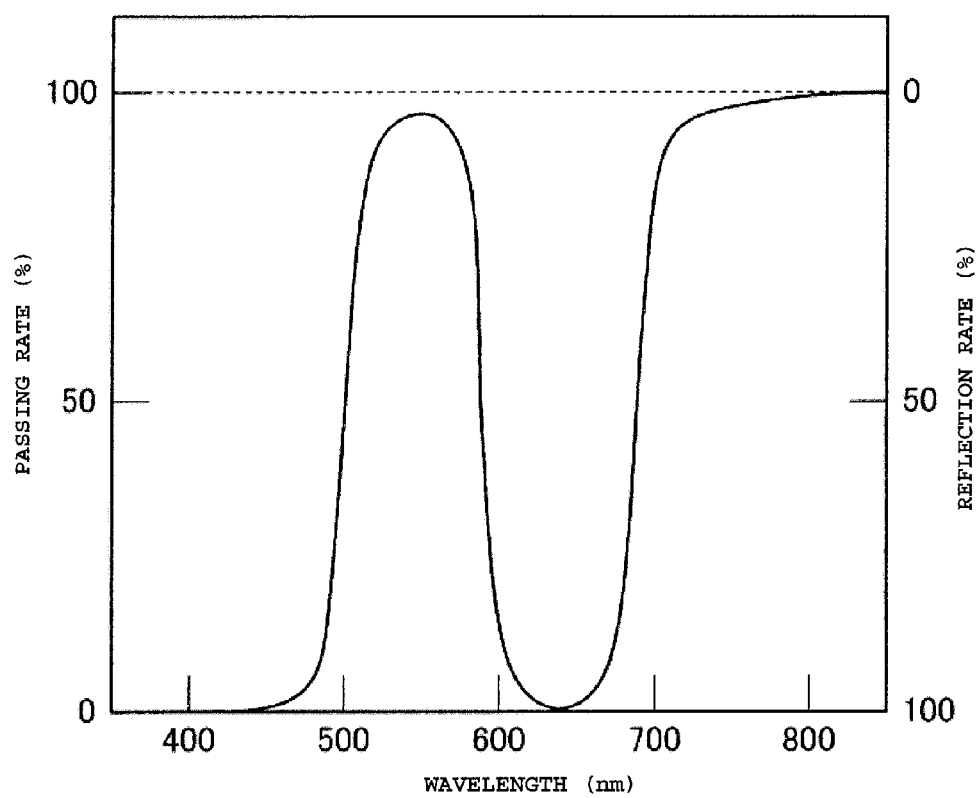
FIG. 17 is a graph showing an example of the spectral characteristics of a wavelength-selective element which passes G light and IR light to a photoelectric conversion element.

FIG. 17 is a graph showing the spectral characteristics of the wavelength-selective element that transmits G light and IR light to the photoelectric conversion element. The wavelength-selective element 42GIR passes G light from 490 nm to 580 nm and IR light longer than 650 nm. B light below 490 nm and R light from 580 nm to 650 nm are reflected. The wavelength shown in this example is one-half the wavelength at which about 50% of the light is blocked.

Figure 18:
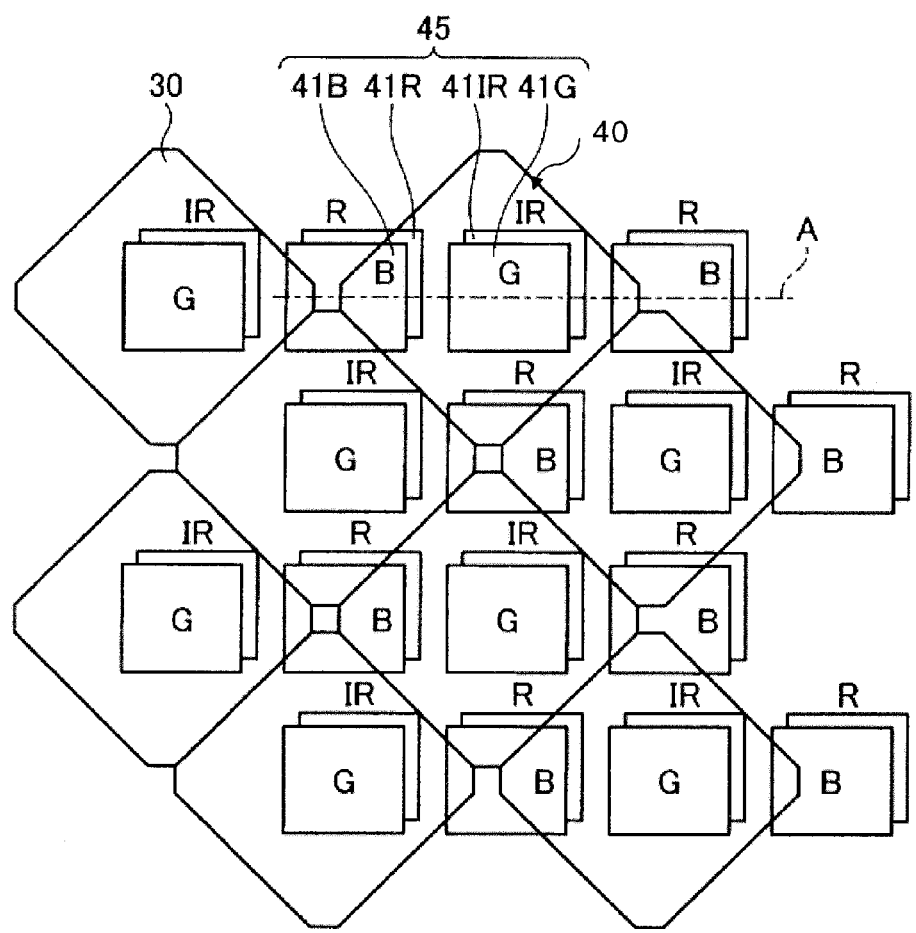
FIG. 18 is a plan view showing another embodiment of the arrangement of a microlens array and a photoelectric conversion element array.

FIG. 18 shows the microlens and photoelectric conversion element. The image sensor 40 is viewed slightly obliquely from the incident side, and the microlens 30 and the photoelectric conversion elements 41R, 41G, 41B, 41IR below the microlens 30 are shown. The section shown in FIG. 16 corresponds to the cross section in the dashed line A in FIG. 18.

The laminated structure including the photoelectric conversion elements 41G and 41IR, and the laminated structure including the photoelectric conversion element 41R and 41B are arranged in a square array. The combination of four photoelectric conversion elements 41G, 41IR, 41B and 41R is repeated in the row direction and defines a cell 45. As with the second reflecting unit 43, in each cell 45 the first transparent layer 24 lies between the wavelength-selective elements 42GIR, 42RB, and the first reflecting unit 25.

The microlens 30 is focused by turning the incident light from the imaging optical system 11 (FIG. 2) to the lens 31 in the layer. The light radiated from lens 31 in the layer goes straight in the first transparent layer 24 for the wavelength-selective element 42GIR. Wavelength-selective element 42GIR passes the G and IR components of the incident light and reflects the R and B components.

The G light passing the wavelength-selective elements 42IR is converted into an electric charge by the photoelectric conversion element 41G. The IR light passed by the wavelength-selective elements 42IR reaches the photoelectric conversion element 41G and the P-type layer, where it is converted into an electric charge by the photoelectric conversion elements 41IR.

Image sensor 40 permits high sensitivity at low illumination by adding the signal detected by photoelectric conversion elements 41IR for intensity information. According to the modified example, a camera for color photography and a camera for monitoring using IR light can be both achieved using a single image sensor 40.

If four pixels of R, G, B, and IR are assumed to be a unit in a 2×2 pixel array on a plane surface, the resolution of G will be one half for all resolutions of the image sensor 40. According to the modified example, the image sensor 40 controls the decrease in the resolution by detecting each color of light on each cell 45.

When four pixels of R, G, B, and IR are arranged as 2×2 pixels on a plane surface, the IR signal mixed with the R, G, and B signals can be removed by subtraction. But this subtraction degrades the color reproduction and the SNR. According to the modified example, the image sensor 40 can achieve excellent color reproduction with minimal degradation of SNR, because no subtraction is used to detect the R, G, and B components that are separated from the IR component.

Figure 19:
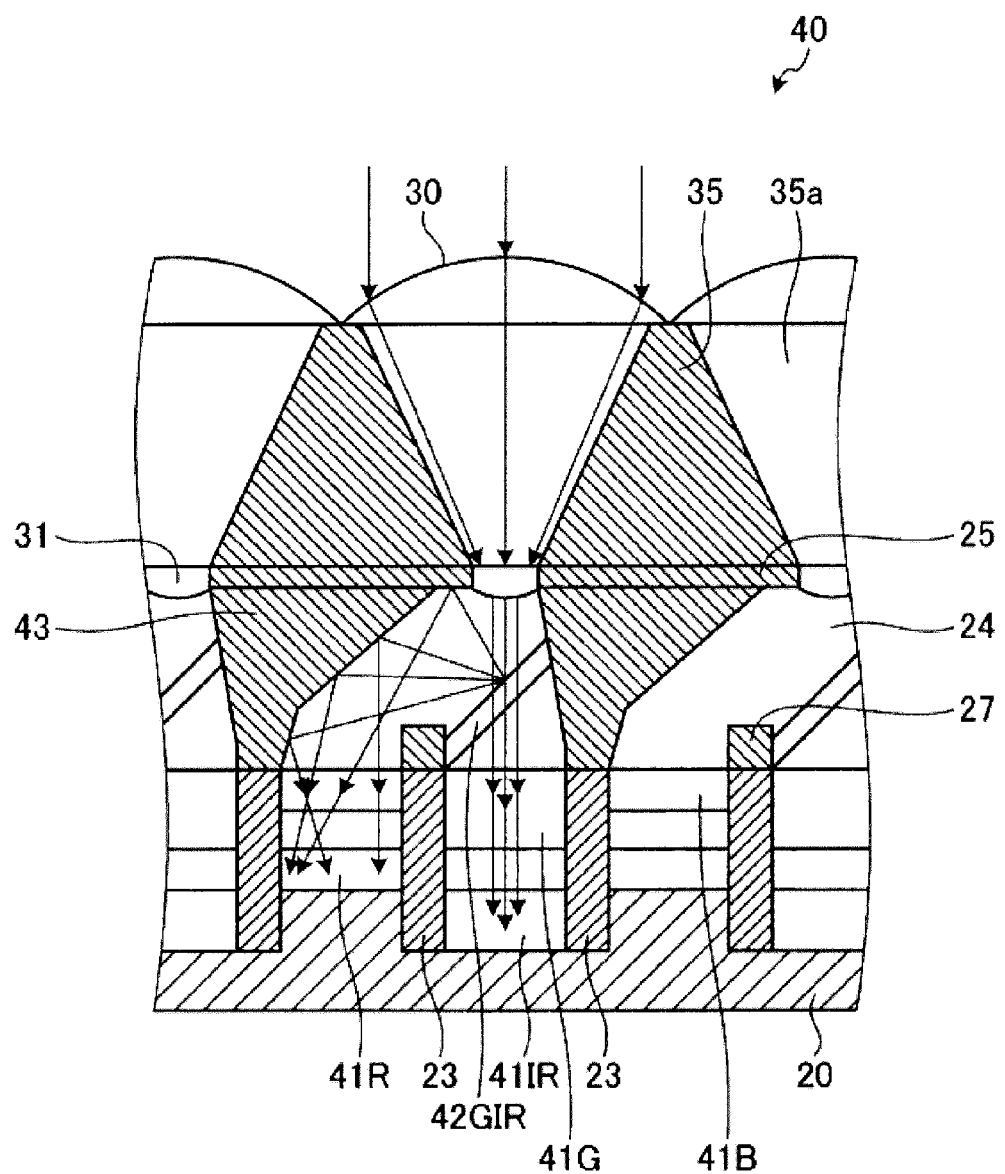
FIG. 19 is a schematic cross-sectional view showing a portion of a solid-state image sensor according to another embodiment.

FIG. 19 is a schematic cross-sectional view of a portion of an image sensor 40 according to another embodiment. The wavelength-selective element 42GIR is installed in the light path between the lens 31 in the layer and the photoelectric conversion element 41G. The wavelength-selective element 42GIR is oriented so that the incidence plane is slanted at about a 45 degree angle relative to the direction of the light path incident from the microlens 30.

The second reflecting units 43 are sloped above the photoelectric conversion element 41B so as to be substantially parallel to the plane of the wavelength-selective element 42GIR. In the modified example 1, a wavelength-selective element 42RB (Refer to FIG. 16) is present on the light-receiving surface of the photoelectric conversion element 41B, but it is omitted in this modified example.

The wavelength-selective element 42GIR passes the G and IR components of the light incident from lens 31 into the layer and reflects the R and B components. The G and IR light transmitted by the wavelength-selective element 42GIR passes straight into the first transparent layer 24 for the photoelectric conversion element 41G.

The R and B light reflected by the wavelength-selective element 42GIR travels to the part opposite the incidence plane of the wavelength-selective element 42GIR and hits the second reflecting unit 43. The second reflecting unit 43 reflects the light incident from the wavelength-selective element 42GIR to the photoelectric conversion element 41B at the bottom and reflects.

In this modified example, the wavelength-selective element 42GIR is oriented so that the second reflecting units 43 redirect the light onto the top part of the photoelectric conversion element 41B. The image sensor 40 can efficiently transmit the R and B light reflected by the wavelength-selective element 42GIR to the photoelectric conversion elements 41B and 41R. As a result, image sensor 40 can increase the light utilization efficiency. Moreover, the wavelength-selective element 42RB of the light-receiving surface of the photoelectric conversion element 41B in the image sensor 40 can be omitted to reduce the parts count and manufacturing cost.

In this embodiment, G and IR light passes through the wavelength-selective element 42GIR, while R and B light is reflected. However, one could equally well use a filter that passes R and B light and reflects the G and IR components.

In addition, the image sensor 40 can also omit the fourth reflecting unit 35 that is described in FIG. 6. However, the image sensor 40 may be modified according to the descriptions of FIGS. 7 and 8. Moreover, like the first embodiment, the second embodiment allows one to adjust the configuration of the microlens and photoelectric conversion element arrays.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state image sensor, comprising:
    an array of microlenses; and
    a plurality of cells, each cell positioned to receive light directed by one of the microlenses and including:
        a first photoelectric conversion element configured to detect light in a first wavelength range;
        a second photoelectric conversion element configured to detect light in a second wavelength range that is different than the first wavelength range;
        a third photoelectric conversion element configured to detect light in a third wavelength range that is different than the first wavelength range and the second wavelength range;
        a first wavelength-selective element that is disposed on the first photoelectric conversion element, transmits the light in the first wavelength range, and reflects light in a wavelength range outside the first wavelength range;
        a second wavelength-selective element that is disposed on the second photoelectric conversion element, transmits the light in the second wavelength range, and reflects light in a wavelength range outside the second wavelength range;
        a third wavelength-selective element that is disposed on the third photoelectric conversion element, transmits the light in the third wavelength range, and reflects light in a wavelength range outside the third wavelength range;
        a transparent member disposed on the first, second, and third wavelength-selective elements; and
        a reflective member including a first reflective portion that has an aperture through which light from the microlens passes, and one or more second reflective portions disposed so as to reflect light reflected by at least one of the first, second, and third wavelength-selective elements.

2. The sensor of claim 1, wherein the first reflective portion is disposed between the microlens and the transparent member.

3. The sensor of claim 2, wherein each of the cells further includes a lens that is disposed in the aperture and focuses the light from the microlens.

4. The sensor of claim 2, wherein each of the cells further includes a diffuser that is disposed in the aperture and diffuses the light reflected by at least one of the first, second, and third wavelength-selective elements.

5. The sensor of claim 2, wherein one of the second reflective portions covers a side surface of the transparent member.

6. The sensor of claim 1, wherein each of the cells further includes a first reflective wall partitioning the first and second photoelectric conversion elements and a second reflective wall partitioning the second and third photoelectric conversion elements.

7. The sensor of claim 6, wherein the first and second reflective walls extend at least partially into the transparent member.

8. The sensor of claim 2, further comprising:
    a second transparent member disposed between the array of microlenses and the first reflective portion of the reflective members.

9. The sensor of claim 8, further comprising:
    a cone-shaped reflector unit disposed between the array of microlenses and the first reflective portion of the reflective member and configured to direct light passing through the second transparent member toward the aperture.

10. The sensor of claim 2, wherein the first reflective portion of the reflective member has a cone-shaped structure that directs light passing through one of the microlenses toward the aperture.

11. The sensor of claim 2, wherein the second photoelectric conversion element is positioned between the third photoelectric conversion element and the aperture.

12. The sensor of claim 11, further comprising:
    a fourth photoelectric conversion element to detect energy in a fourth wavelength range that is different than the first, the second, and the third wavelength range, wherein the first photoelectric conversion element is positioned between the fourth photoelectric conversion element and the aperture.

13. A method of directing light of multiple frequencies to photoelectric conversion elements, comprising:
    providing a plurality of wavelength selective elements, so that each of the wavelength selective elements is disposed on one of the photoelectric conversion elements, each of the wavelength selective elements configured to transmit light of a frequency range different from each other and reflect light outside the frequency range;
    directing light through an aperture formed through a wall towards the wavelength selective elements;
    transmitting the light of different frequency ranges, through the different ones of the plurality of wavelength selective elements, respectively; and
    reflecting light reflected by one the plurality of wavelength selective elements towards the other one of the plurality of wavelength selective elements.

14. The method of claim 13, wherein the light reflected by the one of the plurality of wavelength selective elements is directed towards the other one of the plurality of wavelength selective elements by a plurality of reflective portions.

15. The method of claim 14, wherein the plurality of reflective portions includes a reflector positioned opposite to the plurality of wavelength selective elements.

16. The method of claim 14, wherein the plurality of reflective portions includes a second reflector between the reflector and a surface of one of the plurality of wavelength selective elements.

17. The method of claim 13, wherein a lens which forms parallel light rays towards one of the plurality of wavelength selective elements is disposed in the aperture.

18. The method of claim 13, wherein a diffuser which diffuses light reflected by at least one of the plurality of wavelength selective elements is disposed in the aperture.

19. The method of claim 13, further comprising:
    providing a reflective wall between two of the plurality of wavelength selective elements.

20. A solid-state image sensor comprising:
    an array of photoelectric conversion element cells, each of the cells including a plurality of photoelectric conversion elements;

an array of light collecting optical elements disposed on the array of the photoelectric conversion element cells, each of the cells being positioned to receive light directed by one of the light collecting optical elements;

a plurality of wavelength-selective elements disposed in each of the cells, each of the wavelength-selective elements being positioned on one of the photo conversion elements in each of the cells, and configured to transmit light of a color and reflect light of the other colors; and a reflecting unit disposed in each of the cells, the reflecting unit including one or more reflective portions that are disposed so as to reflect light reflected by one of the wavelength-selective elements.

* * * * *